(12) United States Patent
Shimoda et al.

(10) Patent No.: US 8,673,682 B2
(45) Date of Patent: Mar. 18, 2014

(54) HIGH ORDER SILANE COMPOSITION AND METHOD OF MANUFACTURING A FILM-COATED SUBSTRATE

(75) Inventors: Tatsuya Shimoda, Nomi (JP); Yasuo Matsuki, Tokyo (JP); Takashi Masuda, Komatsu (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 171 days.

(21) Appl. No.: 13/143,854

(22) PCT Filed: Jan. 7, 2010

(86) PCT No.: PCT/JP2010/050362
§ 371 (c)(1),
(2), (4) Date: Sep. 13, 2011

(87) PCT Pub. No.: WO2010/079842
PCT Pub. Date: Jul. 15, 2010

(65) Prior Publication Data
US 2011/0318939 A1 Dec. 29, 2011

(30) Foreign Application Priority Data
Jan. 9, 2009 (JP) .................................. 2009-003554

(51) Int. Cl.
*H01L 51/56* (2006.01)
(52) U.S. Cl.
USPC ........................... 438/99; 438/787; 106/287.1
(58) Field of Classification Search
USPC ................................. 438/99, 787; 106/287.1
See application file for complete search history.

(56) References Cited

U.S. PATENT DOCUMENTS

2009/0155454 A1* 6/2009 Masuda et al. .................. 427/58

FOREIGN PATENT DOCUMENTS

| JP | 60-251114 | 12/1985 |
|----|-----------|---------|
| JP | 60 251114 | 12/1985 |
| JP | 60 255613 | 12/1985 |
| JP | 60-255613 | 12/1985 |
| JP | 2000-31066 | 1/2000 |
| JP | 2003-313299 | 11/2003 |
| JP | 2007 250954 | 9/2007 |
| JP | 2007-250954 | 9/2007 |
| JP | 2008 174416 | 7/2008 |
| JP | 2008-174416 | 7/2008 |
| JP | 2010-159191 | * 7/2010 |

OTHER PUBLICATIONS

International Preliminary Report on Patentability Issued on Jan. 20, 2011 in PCT/JP10/050362 filed Jan. 7, 2010.
International Search Report issued Apr. 20, 2010 in PCT/JP10/50362 filed Jan. 7, 2010.

* cited by examiner

*Primary Examiner* — Zandra Smith
*Assistant Examiner* — Toniae Thomas
(74) *Attorney, Agent, or Firm* — Oblon, Spivak, McClelland, Maier & Neustadt, L.L.P.

(57) ABSTRACT

A composition containing a high order silane compound and a solvent, wherein the solvent contains a cyclic hydrocarbon which has one or two double bonds and no alkyl group, is composed of only carbon and hydrogen and has a refractive index of 1.40 to 1.51, a specific permittivity of not more than 3.0 and a molecular weight of not more than 180. Method of manufacturing a film-coated substrate using the high order silane composition.

17 Claims, 1 Drawing Sheet

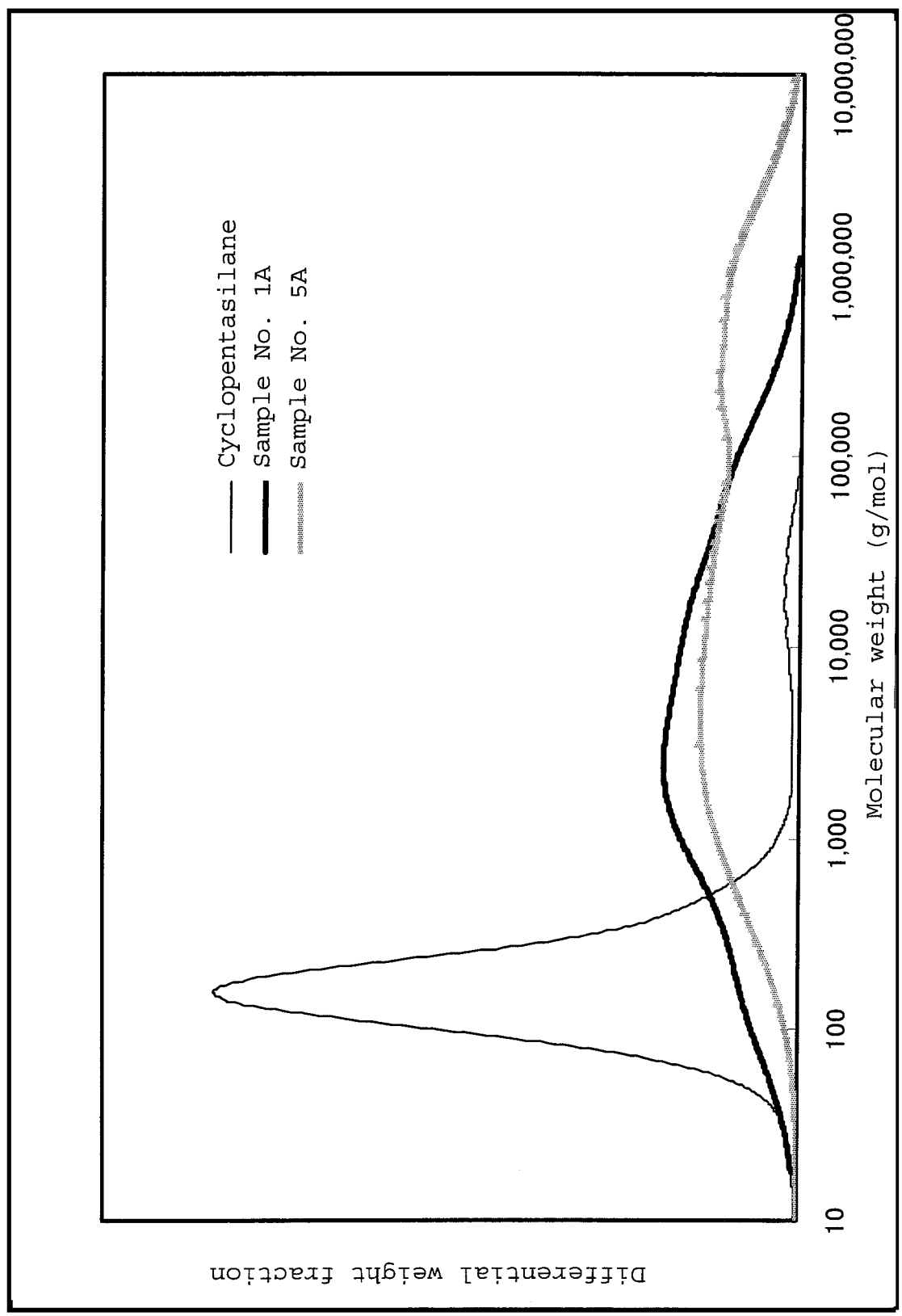

HIGH ORDER SILANE COMPOSITION AND METHOD OF MANUFACTURING A FILM-COATED SUBSTRATE

TECHNICAL FIELD

The present invention relates to a high order silane composition and a method of manufacturing a film-coated substrate.

BACKGROUND ART

The patterning of a silicon film (such as an amorphous silicon film or a polycrystal silicon film) used with integrated circuits and thin film transistors is generally carried out through a process in which a silicon film is formed over the whole surface by a vapor-phase process such as CVD (Chemical Vapor Deposition) and then unwanted parts are removed by photolithography.

However, this method has problems such as a bulky apparatus being required due to use of the vapor-phase process, the use efficiency of the raw material being poor, the raw material being difficult to handle as it is gaseous, and a large amount of waste being produced.

To cope with these problems, studies into a method of forming a silicon film by a liquid-phase process are now under way. For example, there is proposed a method of forming a silicon film by applying a high order silane composition comprising a liquid silane compound (such as cyclopentasilane), a high order silane compound obtained by photopolymerizing this liquid silane compound by irradiation with ultraviolet light, and an organic solvent such as decalin, tetralin, methyl naphthalene, toluene, decane, octane, xylene or benzene onto a substrate, removing the solvent, and heating the composition (refer, for example, to JP-A 2003-313299).

However, the above high order silane compound has low solubility in the solvent used in this high order silane composition. That is, when only the above organic solvent is used in this high order silane composition without using the liquid silane compound, it cannot dissolve the high order silane compound having a molecular weight high enough to form a silicon film having a desired thickness in a sufficiently high concentration. However, the high order silane compound is soluble in the above liquid silane compound (low order silane compound) which is soluble in the above solvent. Therefore, in the high order silane composition disclosed by JP-A 2003-313299, the high order silane compound is made coexistent with the low order silane compound so that the high order silane compound is dissolved in the solvent. That is, it can be understood that the high order silane compound contained in the high order silane composition disclosed by the above publication is dissolved in a mixed solvent of the above solvent and the low-order silane compound.

To increase the molecular weight and content of the high order silane compound in this high order silane composition, the content of the low order silane compound must be increased. However, as the low order silane compound has high reactivity with oxygen and the vapor pressure is high, the mixed solvent becomes unstable.

In view of the above situation, the development of a high order silane composition having high stability and excellent safety, and comprising a high order silane compound having a sufficiently high molecular weight and a sufficiently high concentration to form a high-quality film having a desired thickness is desired.

DISCLOSURE OF THE INVENTION

It is an object of the present invention to provide a stable high order silane composition from which a high-quality film having a desired thickness can be formed by using a liquid-phase process and a method of manufacturing a film-coated substrate, capable of forming a high-quality film having a desired thickness on a substrate by using a liquid-phase process.

Firstly, the above object and advantage of the present invention are attained by a composition which comprises a high order silane compound and a solvent, wherein the solvent contains a cyclic hydrocarbon which has one or two double bonds and no alkyl group, is composed of only carbon and hydrogen and has a refractive index of 1.40 to 1.51, a specific permittivity of not more than 3.0 and a molecular weight of not more than 180.

Secondly, the above object and advantage of the present invention are attained by a method of manufacturing a film-coated substrate, comprising the first step of supplying the above high order silane composition onto a substrate and the second step of removing the solvent from the high order silane composition to form a film of the high order silane compound.

BRIEF DESCRIPTION OF THE DRAWINGS

FIG. 1 shows GPC-MALLS charts of cyclopentasilane used in the <step 1A> of Example 1, the high order silane compound obtained in the <step 3A> of Example 1 and the high order silane compound obtained in Example 3. These charts show data obtained by measuring the compounds separated by GPC with MALLS.

BEST MODE FOR CARRYING OUT THE INVENTION

The high order silane composition and the method of manufacturing a film-coated substrate of the present invention will be described in detail hereinunder with reference to preferred embodiments.

<High Order Silane Composition>

A description is first given of the high order silane composition of the present invention.

The high order silane composition of the present invention comprises a high order silane compound and a solvent.

[High Order Silane Compound]

The high order silane compound in the present invention is a polymer of a low order silane compound which will be described hereinafter. This high order silane compound is a compound which is converted into silicon (amorphous silicon or polycrystal silicon) by at least one treatment selected from the group consisting of a heat treatment and a light treatment in a nonoxidizing atmosphere or which is converted into silicon oxide by at least one treatment selected from the group consisting of a heat treatment and a light treatment in an oxidizing atmosphere.

This high order silane compound preferably has a higher boiling point than its decomposition temperature. When a silicon film or a silicon oxide film is to be obtained by baking this high order silane compound to convert it into silicon or silicon oxide, it is possible to avoid the loss of the high order silane compound through gasification or evaporation before it is completely converted into silicon or silicon oxide. When a high order silane compound having a higher boiling point than its decomposition temperature is actually heated, it is decomposed before its temperature reaches its boiling point. Therefore, the boiling point of the high order silane compound cannot be actually measured. The term "boiling point" as used herein means a theoretical value obtained from the temperature dependence of its vapor pressure or by theoretical calculation. Also, the boiling point as used herein means a boiling point at normal pressure.

This high order silane compound is preferably a polymer compound having an element ratio represented by the following compositional formula (1).

$$SiX_m \tag{1}$$

(in the above formula, X is a hydrogen atom or a halogen atom, and m is 1 to 3.)

"m" is more preferably 1.5 to 2.5.

The polymerization degree, that is, the average value of the number "n" of silicon atoms contained in one molecule of the high order silane compound is preferably 5 or more, more preferably 8 to 400, much more preferably 10 to 250. The average value of the polymerization degree "n" can be calculated as a value obtained by dividing the weight average absolute molecular weight (weight average value of absolute molecular weight) measured by gel permeation chromatography-multi-angle laser light scattering analysis (PGC-MALLS) by the formula weight of $SiX_2$ (X is as defined in the above formula (1)).

The melting point, boiling point and adhesion to a substrate of the high order silane compound and the wettability to the substrate and viscosity of the high order silane composition comprising the high order silane compound greatly depend on the magnitude of "n". As the polymerization degree "n" of the high order silane compound becomes higher (that is, the molecular weight of the high order silane compound becomes higher), the melting point and boiling point of the high order silane compound, the viscosity of the high order silane composition and the adhesion to the substrate of the formed film tend to become higher, and the reactivity with oxygen of the high order silane composition tends to become lower. Therefore, by using a high order silane compound having a high molecular weight with an average value of "n" within the above range, a homogeneous film which is uniform in thickness can be formed without fail in the film forming step which will be described hereinafter. Further, since the high order silane compound having a high molecular weight has low reactivity, it is easy to handle it. However, a high order silane compound having an average value of "n" of more than 400 becomes a hard solid mass which is difficult to be weighed disadvantageously.

The method of producing this high order silane compound is not particularly limited. For example, a low order silane compound such as a silane compound or a halogenated silane compound is used as a starting material, and this low order silane compound is polymerized preferably in a solution to obtain a high order silane compound. In the present invention, the low order silane compound is a compound which is polymerized to obtain a high order silane compound and preferably gaseous or liquid at normal temperature under normal pressure. As the low order silane compound may be used a low order silane compound which is polymerized, for example, by the irradiation of light or an electron beam, or heating to become a high order silane compound. A low order silane compound having photopolymerizability that it is converted into a high order silane compound by the irradiation of light, especially ultraviolet light, is preferably used. By using this low order silane compound as the starting material, a high order silane compound having a relatively high molecular weight can be easily obtained. Further, it is relatively easy to control the molecular weight of the obtained high order silane compound.

The above low order silane compound having photopolymerizability is preferably a silane compound or halogenated silane compound having at least one cyclic structure in the molecule, more preferably at least one silane compound selected from the group consisting of compounds represented by the following formulas (2) and (3).

$$Si_iX_{2i} \tag{2}$$

$$Si_jX_{2j-2} \tag{3}$$

(in the above formulas, X is a hydrogen atom or halogen atom, i is an integer of 3 to 8, and j is an integer of 4 to 14.)

The compound represented by the above formula (2) is a silane compound or halogenated silane compound having one cyclic structure in the molecule, and the compound represented by the above formula (3) is a silane compound or halogenated silane compound having two cyclic structures in the molecule.

Examples of the low order silane compound represented by the above formula (2) include cyclotrisilane, cyclotetrasilane, cyclopentasilane, cyclohexasilane and cycloheptasilane; and examples of the low order silane compound represented by the above formula (3) include 1,1'-bicyclobutasilane, 1,1'-bicyclopentasilane, 1,1'-bicyclohexasilane, 1,1'-bicycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2.2]pentasilane, spiro[3.3]heptasilane, spiro[4.4]nonasilane, spiro[4.5]decasilane, spiro[4.6]undecasilane, spiro[5.5]undecasilane, spiro[5.6]dodecasilane and spiro[6.6]tridecasilane. Compounds obtained by substituting some or all of the hydrogen atoms of any one of these compounds by $SiH_3$ or a halogen atom may also be used. "i" in the above formula (2) is preferably an integer of 3 to 7, and "j" in the above formula (3) is preferably an integer of 4 to 7. These compounds may be used alone or in combination of two or more. These low order silane compounds have very high optical reactivity and can cause photopolymerization efficiently.

The low order silane compound is preferably a compound represented by the above formula (2), particularly preferably at least one selected from the group consisting of cyclotetrasilane, cyclopentasilane, cyclohexasilane and cycloheptasilane from the viewpoint of synthesis and refinement being easy, as well as for the reasons described above.

The above low order silane compound may contain a silane compound having no cyclic structure such as pentasilane, hexasilane, heptasilane or polydihydrosilane, or a modified silane compound modified by a boron atom or a phosphorus atom as required as long as its photopolymerization process through the irradiation of ultraviolet light is not impaired. The content of the silane compound having no cyclic structure or the modified silane compound which is optionally used is preferably not more than 30 wt %, more preferably not more than 15 wt % based on the total of it and the low order silane compound.

The solvent contained in the solution for polymerizing the low order silane compound is not particularly limited but is selected from a hydrocarbon solvent, an ether solvent and a polar solvent.

Examples of the above hydrocarbon solvent include hexane, heptane, octane, decane, dicyclopentane, benzene, toluene, xylene, durene, indene, tetrahydronaphthalene, decahydronaphthalene and squalane; examples of the above ether solvent include dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran, 1,2-dimethoxyethane, bis(2- methoxyethyl)ether and p-dioxane; and examples of the above polar solvent include propylene carbonate, γ-butyrolactone, N-methyl-2-pyrrolidone, dimethyl formamide, acetonitrile and dimethyl sulfoxide. They may be used alone or in combination.

The ultraviolet light to be irradiated onto the low order silane compound is preferably light having a wavelength which can polymerize the low order silane compound without fail and does not decompose the above solvent. The expression "wavelength which does not decompose the solvent" means a wavelength at which the chemical bond in the molecule of the solvent is not broken by the irradiation of ultraviolet light. It is preferably 200 to 500 nm, more preferably 254 to 420 nm. By using ultraviolet light having the above wavelength range, a precursor can be polymerized without fail and an impurity atom such as a carbon atom derived from the solvent can be prevented from being mixed into the solid high order silane compound when the high order silane compound is isolated as will be described hereinafter. As a result, the deterioration of the characteristic properties of the film formed from this high order silane compound can be prevented.

The irradiation intensity of the ultraviolet light is not particularly limited but preferably 0.1 to 5,000 mW/cm$^2$, more preferably 0.5 to 3,000 mW/cm$^2$. The irradiation time of the ultraviolet light is not particularly limited but preferably 10 seconds to 20 hours, more preferably 10 minutes to 10 hours. By applying the ultraviolet light having the above irradiation intensity for the above irradiation time, a high order silane compound having a distribution peak at the above preferred range of polymerization degree "n", that is, a high order silane compound having an appropriate molecular weight distribution can be obtained.

The molecular weight distribution of the obtained high order silane compound can be controlled by the wavelength, irradiation intensity and irradiation time of the ultraviolet light. By irradiating the ultraviolet light under the above irradiation conditions, a high order silane compound having a distribution peak at the above appropriate range of polymerization degree "n", that is, a high order silane compound having an appropriate molecular weight distribution can be obtained.

To isolate the high order silane compound from a solution containing the high order silane compound obtained by polymerizing the low order silane compound, the following method may be employed.

That is, when the high order silane compound is dissolved in the solution, the high order silane compound can be isolated, for example, by using size exclusion chromatography (SEC). When the high order silane compound separates out from the solution, the high order silane compound can be isolated, for example, by filtration with a microfilter.

As long as the high order silane compound is kept liquid or solid at normal temperature under normal pressure, it may contain a small amount of a low order silane compound. Examples of the low order silane compound are the same compounds enumerated as the starting material of the high order silane compound. When the low order silane compound is used, the content of the low order silane compound is preferably not more than 50 wt %, more preferably not more than 20 wt % based on the total of it and the high order silane compound.

[Solvent]

The solvent contained in the high order silane composition of the present invention contains a cyclic hydrocarbon which has one or two double bonds and no alkyl group, is composed of only carbon and hydrogen and has a refractive index of 1.40 to 1.51, a specific permittivity of not more than 3.0 and a molecular weight of not more than 180. The above refractive index is a value for NaD line (average wavelength λ=598.26 nm) at 20° C. and represented by "$N_D^{20}$" among people having ordinary skill in the art. The above specific permittivity is a value at 20° C.

The above-described high order silane compound has a problem that it has low solubility in a general-purpose solvent such as decalin, tetralin, methyl naphthalene, toluene, decane, octane, xylene or benzene which is preferably used to dissolve a saturated hydrocarbon polymer.

This is considered to be due to the fact that a carbon atom in the molecular structure of the high order silane compound is substituted by a silicon atom as compared with a saturated hydrocarbon having the same structure.

That is, the volume [v] of the atom contained in the molecular structure is related to electronic polarizability [$α_0$] as shown by the following mathematical formula (1). The formula (1) is known as Lorenz-Lorentz formula.

$$\frac{a_0}{4\pi\varepsilon_0} = \left(\frac{N^2-1}{N^2+2}\right)\frac{3v}{4\pi} \tag{1}$$

(in the above formula (1), $\varepsilon_0$ is the dielectric constant of vacuum, and N is a refractive index.)

Further, the electronic polarizability [$α_0$] is proportional to agglomeration energy [U] (London dispersion force [w(r)$_{London}$]) applied between two particles of the same kind as shown by the following mathematical formula (2). The formula (2) is known as London formula.

$$U \propto w(r)_{London} \propto -\frac{3}{4}\frac{a_0^2 h\upsilon}{(4\pi\varepsilon_0)^2 r^6} \tag{2}$$

(in the above formula (2), h is the Planck's constant, ν is the absorption frequency of the outermost electron, $\varepsilon_0$ is the dielectric constant of vacuum, and r is the distance between particles, with the provision that the particles are spherical.)

Therefore, the agglomeration energy [U] is the function of the volume [v] of the atom, the absorption frequency [υ] of the outermost electron and the refractive index N as shown by the following mathematical formula (3).

$$U \propto v^2\upsilon\left(\frac{N^2-1}{N^2+2}\right)^2 \tag{3}$$

The absorption frequency [υ] of the outermost electron is greatly changed by the number of double bonds and the existence of a conjugated structure in the molecular structure. The refractive index [N] is changed by the number of double bonds, the existence of the conjugated structure and the size of the molecule. It is considered from these that the size of the atom, the state of the outermost electron and the refractive index are changed by the substitution of the carbon atom in the molecular structure by a silicone atom, thereby greatly changing agglomeration energy in the molecular structure with the result of a marked change in solubility.

When force applied between low-polarity substances or nonpolar substances having a small specific permittivity of not more than 10 like a high order silane compound is taken into consideration, the influence of molecular polarizability is negligibly small as compared with the influence of electronic polarizability. Therefore, the agglomeration energy of the low-polarity substance or the nonpolar substance can be regarded as equivalent to London dispersion force derived from electronic polarizability. The solvent which dissolves the low-polarity substance or the nonpolar substance like a high order silane compound must be a low-polarity substance or a nonpolar substance like the high order silane compound which is a solute.

The dispersion self-energy [$\Delta\mu_{dispersion}$] of the high order silane compound into the solvent, that is, the change of chemical potential when the high order silane compound is transferred into the solvent has the relationship represented by the following mathematical formula (4) when the agglomeration energy of the high order silane compound is represented by $U_1$ and the agglomeration energy of the solvent is represented by $U_2$. Therefore, as the difference between the agglomeration energy of the high order silane compound and the agglomeration energy of the solvent becomes smaller, the dispersion self-energy becomes smaller. Consequently, it is found that as the difference between the agglomeration energy $U_1$ of the high order silane compound and the agglomeration energy $U_2$ of the solvent becomes smaller, the high order silane compound is dissolved in the solvent more easily.

$$\Delta\mu_{dispersion} \propto -(\sqrt{U_1}-\sqrt{U_2})^2 \quad (4)$$

That is, it is found that, to dissolve the high order silane compound in the solvent, the agglomeration energy $U_2$ of the solvent in use must be adjusted to an optimal value. It is also found that, to dissolve a substance having a small dielectric constant like the high order silane compound in the solvent, a solvent which has a small dielectric constant [$\in$] like the high order silane compound and appropriate values of the refractive index [N], the size [v] of the atom and the absorption frequency [υ] of the outermost electron all of which are correlative with the size of agglomeration energy and are spherical or almost spherical or symmetrical in structure as the premise of the above explanation must be selected as the solvent. The size [v] of the atom can be substituted by the size of a molecule which is the assembly of atoms, and the absorption frequency [υ] of the outermost electron can be substituted by the number of double bonds.

When the inventors of the present invention have conducted intensive studies on the solubility of the high order silane compound of the present invention, they have found that a cyclic hydrocarbon which has one or two double bonds and no alkyl group, is composed of only carbon and hydrogen, and has a refractive index of 1.40 to 1.51, a specific permittivity of not more than 3.0 and a molecular weight of not more than 180 can suitably dissolve the above high order silane compound. They have also found that this cyclic hydrocarbon has advantages that it is easy to handle as a solvent due to its low chemical reactivity and can improve the safety of the high order silane composition. The above alkyl group is a monovalent saturated hydrocarbon group. When the above cyclic hydrocarbon has delocalized double bonds, the number of double bonds is the number of double bonds in the ultimate structural formula having the largest number of double bonds out of the ultimate structural formulas of the cyclic hydrocarbon.

The number of double bonds in the above cyclic hydrocarbon is preferably one. Thereby, the values of refractive index [N] and absorption frequency [υ] become optimal with the result that the value of agglomeration energy becomes optimal.

The above cyclic hydrocarbon has no alkyl group. In the structure in which an alkyl group is bonded to the ring, local polarization occurs. Then, the bad effect on solubility of polarity can be prevented with a cyclic structure having no alkyl group. Since a branched structure like an alkyl group is not contained in the molecular structure, the symmetry of the molecular structure is improved.

The above cyclic hydrocarbon is composed of only carbon atoms and hydrogen atoms as constituent elements. A molecule having a structure composed of only carbon atoms and hydrogen atoms has low polarity so that the bad effect on solubility of polarity can be prevented.

The above cyclic hydrocarbon has a molecular weight of not more than 180. The molecular weight of the above cyclic hydrocarbon is preferably 60 to 160, more preferably 65 to 120. Thereby, the cyclic hydrocarbon becomes a molecule having an optimal value of agglomeration energy.

The above cyclic hydrocarbon has a cyclic structure. Since its molecule has a cyclic structure, the symmetry of the molecular structure is improved. Since the molecular structure is symmetric, its polarity becomes low so that the bad effect on solubility of polarity can be prevented. The above ring includes a single ring and a multi-ring. Examples of the multi-ring include condensed ring, bridge ring and bridge condensed ring.

The above cyclic hydrocarbon has a refractive index of 1.40 to 1.51. The refractive index of the above cyclic hydrocarbon is preferably 1.41 to 1.50, more preferably 1.42 to 1.49. When the refractive index falls within this range, the cyclic hydrocarbon takes an optimal value of agglomeration energy.

The above cyclic hydrocarbon has a specific permittivity of not more than 3.0. The specific permittivity of the above cyclic hydrocarbon is preferably not more than 2.5, more preferably not more than 2.3. As the specific permittivity becomes smaller, the bad effect on solubility of polarity can be prevented.

Preferred examples of the cyclic hydrocarbon include 1,2,3,4,4a,5,6,8a-octahydronaphthalene, 1,2,3,4,5,6,7,8-octahydronaphthalene, 1,2,3,4,5,8-hexahydronaphthalene, 1,2,3,4,5,6-hexahydronaphthalene, 1,2,4a,5,8,8a-hexahydronaphthalene, 2,3,3a,4,5,7a-hexahydro-1H-indene, 2,3,3a,4,7,7a-hexahydro-1H-indene, 2,3,3a,4,5,6-hexahydro-1H-indene, 2,3,4,5,6,7-hexahydro-1H-indene, 2,4,7,7a-tetrahydro-1H-indene, 2,3,4,7-tetrahydro-1H-indene, 2,3,4,5-tetrahydro-1H-indene, 4,5,6,7-tetrahydro-1H-indene, 4,5,6,7-tetrahydro-2H-indene, 1,2,3,3a,4,6a-hexahydropentalene, 1,2,3,3a,4,5-hexahydropentalene, 1,2,3,4,5,6-hexahydropentalene, 1,2,3,4-tetrahydropentalene, 1,2,6,6a-tetrahydropentalene, 1,3a,6,6a-tetrahydropentalene, cyclopropene, cyclobutene, cyclobuta-1,2-diene, cyclobuta-1,3-diene, cyclopentene, cyclopenta-1,2-diene, cyclopenta-1,3-diene, cyclohexene, cyclohexa-1,2-diene, cyclohexa-1,3-diene, cyclohexa-1,4-diene, cycloheptene, cyclohepta-1,2-diene, cyclohepta-1,3-diene, cyclohepta-1,4-diene, cyclooctene, cycloocta-1,2-diene, cycloocta-1,3-diene, cycloocta-1,4-diene, cycloocta-1,5-diene, cyclononene, cyclonona-1,2-diene, cyclonona-1,3-diene, cyclonona-1,4-diene, cyclonona-1,5-diene, cyclodecene, cyclodeca-1,2-deine, cyclodeca-1,3-diene, cyclodeca-1,4-diene, cyclodeca-1,5-diene, cyclodeca-1,6-diene, bicyclo[2.2.1]hepta-2-ene, bicyclo[2.2.1]hepta-1-ene, bicyclo[2.2.1]hepta-1,3-diene, bicyclo[2.2.1]hepta-2,5-diene, bicyclo[2.2.2]octa-2-ene, bicyclo[2.2.2]octa-2,5-diene, bicyclo[2.2.2]octa-1,2-diene, bicyclo[2.2.2]octa-1,5-diene, bicyclo[2.2.2]octa-1,4-diene, 1,1'-bi(cyclohexa-3-ene), 1-cyclohexylcyclohexa-1,4-diene, 5-cyclohexylcyclohexa-1,3-diene, (1R,6S)-bicyclo[4.2.0]octa-3-ene and (1R,6S)-bicyclo[4.2.0]octa-3,7-diene. They may be used alone or in combination.

The above cyclic hydrocarbon is most preferably a cyclic hydrocarbon which has one double bond and no alkyl group, is composed of only carbon and hydrogen and has a refractive index of 1.42 to 1.49, a specific permittivity of not more than 2.3 and a molecular weight of 65 to 120. Thereby, even when the high order silane compound has a high polymerization degree "n", for example, an average value of "n" of not less than 150, the cyclic hydrocarbon can dissolve the high order silane compound in a concentration of not less than 10 wt % without fail.

The solvent contained in the high order silane composition of the present invention may be composed of only the above cyclic hydrocarbon or a mixed solvent of the above cyclic hydrocarbon and another solvent. The solvent which can be used in combination with the cyclic hydrocarbon is not particularly limited but preferably a compound having a silicon atom in the molecule. Since this solvent has larger agglomeration energy than that of a hydrocarbon solvent having a corresponding structure and agglomeration energy close to that of the high order silane compound, it can be advantageously used to adjust the agglomeration energy of the mixed solvent.

Examples of the compound having a silicon atom in the molecule include bis(indenyl)dimethylsilane, bromomethyltrimethylsilane, bromophenyltrichlorosilane, t-butyldiphenylchlorosilane, t-butyldiphenylcyanosilane, chlorophenyltrichlorosilane, diallyldiphenysilane, dichlorophenyltrichlorosilane, diethyldiphenylsilane, dimethyldiphenylsilane, diphenylchlorosilane, diphenyldichlorosilane, diphenydimethoxysilane, diphenyldivinylsilane, diphenylmethylchlorosilane, diphenylmethylethoxysilane, diphenylmethylsilane, diphenylmethylvinylsilane, diphenylsilane, hexaphenyldisiloxane, phenylethynyldimethylsilane, (phenylselenomethyl)trimethylsilane, tetrabromosilane, tetraphenoxysilane, 1,1,5,5-tetraphenyl-1,3,3,5-tetramethyltrisiloxane, vinyldiphenylchlorosilane, vinyldiphenylethoxysilane and vinyltriphenoxysilane. They may be used alone or in combination.

When the solvent contained in the high order silane composition is a mixture of the above cyclic hydrocarbon and the compound having a silicon atom in the molecule, the mixing ratio is not particularly limited but the volume ratio of the cyclic hydrocarbon to the compound having a silicon atom in the molecule is preferably 99:1 to 20:80, more preferably 95:5 to 90:10. When the ratio falls within the above range, it is easy to handle the mixed solvent and the agglomeration energy value of the mixed solvent can be easily adjusted.

The solvent contained in the high order silane composition of the present invention is preferably composed of only the above cyclic hydrocarbon or a mixed solvent of the above cyclic hydrocarbon and the above compound having a silicon atom in the molecule. By using only the above cyclic hydrocarbon as the solvent, even when the composition does not contain a low order silane compound, a stable composition having a high content of the high order silane compound can be prepared and a film having a desired thickness can be formed relatively easily advantageously in the method of manufacturing a film-coated substrate which will be described hereinafter. Meanwhile, by using a mixed solvent of the above cyclic hydrocarbon and the above compound having a silicon atom in the molecule as the solvent, it is possible to easily adjust the agglomeration energy of the solvent advantageously.

[Other Additives]

The high order silane composition of the present invention comprises the above high order silane compound and the above solvent as essential ingredients and may further comprise other additives as long as they do not diminish the effect of the present invention. The other additives include a dopant source and a surface tension control agent.

The above dopant source is a substance containing a group 3B element of the periodic table or a substance containing a group 5B element of the periodic table (such as phosphorus, boron or arsenic). When the high order silane composition of the present invention comprises the above substance, a silicon film doped with the above element, that is, an n type silicon film or a p type silicon film can be obtained. Examples of the dopant source are substances enumerated in JP-A 2000-31066. The content of the dopant source in the high order silane composition is suitably selected according to the finally required content of the dopant in the obtained silicon film.

As the above surface tension control agent may be used a fluorine-based, silicone-based or nonionic surfactant. The wettability to the substrate of the high order silane composition is improved and the leveling property of a liquid film formed on the substrate is improved by adding the surface tension control agent, thereby making it possible to prevent the occurrence of lumps in the formed film and the occurrence of orange peel.

[High Order Silane Composition]

The high order silane composition of the present invention is prepared as a solution containing the above high order silane compound and optional other additives dissolved in the above specific solvent.

The content of the high order silane compound in the high order silane composition of the present invention should be suitably set according to the target film thickness but preferably 1 to 50 wt %, more preferably 5 to 45 wt %. By setting the content of the high order silane compound to the above range, the nonuniform precipitation of the high order silane compound in the high order silane composition is prevented. As a result, a homogeneous film which is uniform in thickness is obtained with more certainty. By suitably setting the content of the high order silane compound to the above range, the thickness of the formed high order silane compound film can be set to a desired value.

The viscosity at normal temperature of the high order silane composition prepared as described above is preferably 0.4 to 100 mPa·S, more preferably 0.5 to 20 mPa·s. Thereby, a film having a desired and uniform thickness can be obtained. The viscosity of the high order silane composition can be easily adjusted by selecting the molecular weight distribution and content of the high order silane compound and the type of the solvent.

<Method of Manufacturing a Film-Coated Substrate>

A description is subsequently given of the method of manufacturing a film-coated substrate by using the above-described high order silane composition.

The method of manufacturing a film-coated substrate of the present invention comprises at least the first step of supplying the high order silane composition onto a substrate to form a liquid film of the high order silane composition and the second step of removing the solvent from the high order silane composition to form a film of the high order silane compound and preferably further the third step of subjecting the film of the high order silane compound to at least one treatment selected from the group consisting of a heat treatment and a light treatment after the above second step.

[First Step]

Although the above substrate to which the method of manufacturing a film-coated substrate of the present invention is applied is not particularly limited, a quartz substrate, a glass substrate made of borosilicate glass or soda glass; a metal substrate made of gold, silver, copper, silicon, nickel, titanium, aluminum or tungsten; a glass substrate or plastic substrate having such a metal, an oxide thereof or a mixed oxide (for example, a transparent electrode of ITO) on the surface may be used.

To supply the high order silane composition of the present invention onto the substrate, a suitable coating method such as spin coating, roll coating, curtain coating, dip coating, spraying or droplet discharging may be employed.

The droplet discharging method is a method in which a liquid film of the high order silane composition is formed in a desired pattern by discharging droplets of the high order silane composition to desired regions.

In the above droplet discharging method, the high order silane composition may be sprayed at the time of discharging, or the high order silane composition may be discharged such that the droplets are discharged one after another. When spin coating is used, the revolution of the spinner which slightly differs according to the target thickness and the composition of the high order silane composition is preferably 100 to 5,000 rpm, more preferably 300 to 3,000 rpm.

The supply of the high order silane composition onto the substrate is preferably carried out at a temperature range at which the high order silane composition is not solidified or the high order silane compound does not separate out. At this temperature range, the high order silane composition can be supplied properly.

The supply of the high order silane composition onto the substrate is preferably carried out in an atmosphere having reduced contents of water and oxygen, and a solvent and additives having reduced contents of water and oxygen are preferably used. The deterioration of the high order silane compound through a reaction with water and oxygen can be prevented without fail by reducing the contents of water and oxygen in the atmosphere, the solvent and the additives.

The high order silane composition of the present invention has such high wettability to the substrate that a uniform liquid film can be easily formed.

[Second Step]

Then, the substrate having a liquid film of the high order silane composition is preferably heated to remove the solvent from the liquid film so as to form a film of the high order silane compound on the substrate.

The heating temperature is suitably set according to the type of the solvent and the atmosphere so that the solvent can be removed by gasification efficiently. It is thereby possible to prevent the obtained film from becoming nonuniform in thickness and elements derived from the solvent from remaining as impurities. The heating temperature of the substrate is preferably 50° C. or higher and lower than 250° C., more preferably 80° C. to 200° C. The heating time is preferably 0.5 to 180 minutes, more preferably 1 to 120 minutes.

This heating is preferably carried out in an atmosphere of an inert gas such as nitrogen, helium or argon or in a nonoxidizing atmosphere such as a vacuum state. Thereby, the deterioration of the high order silane compound in this stage can be prevented with more certainty.

[Third Step]

Then, the film of the high order silane compound formed as described above is preferably subjected to at least one treatment selected from the group consisting of a heat treatment and a light treatment.

By making the atmosphere for carrying out this third step a nonoxidizing atmosphere, the above high order silane compound is converted into silicon, thereby making it possible to obtain a substrate having a silicon film. Meanwhile, by carrying out the third step in the following two stages, a substrate having a silicon oxide film can be obtained. That is, a heat treatment is first carried out in a nonoxidizing atmosphere to convert the above high order silane compound into silicon which is then subjected to a heat treatment in an oxidizing atmosphere to convert the silicon into silicon oxide. Further, by making the atmosphere for carrying out the third step an oxidizing atmosphere, the above high order silane compound is also converted into silicon oxide, thereby making it possible to obtain a substrate having a silicon oxide film.

To produce a substrate having a silicon film, it is preferred that a heat treatment should be carried out, or a light treatment should be carried out after a heat treatment in the third step.

The above heat treatment is carried out at a higher temperature than the decomposition temperature of the high order silane compound, whereby the high order silane compound is decomposed to become silicon.

The crystallinity of the silicon film obtained herein can be controlled by the heat treatment temperature.

For example, when the heat treatment is carried out in such a manner that the temperature reached is higher than 550° C., preferably higher than 550° C. and not more than 1,200° C., a substrate having a polycrystal silicon film can be obtained.

When the heat treatment is carried out in such a manner that the temperature reached is 550° C. or lower, an amorphous silicon film can be obtained. In this case, the temperature reached is preferably 250° C. to 450° C., more preferably 300° C. to 400° C. When the temperature reached is lower than the above lower limit, the thermal decomposition of the high order silane compound does not proceed fully and the high order silane compound may be oxidized upon exposure to the atmosphere after the heat treatment.

The heat treatment time is not particularly limited but preferably 10 to 240 minutes, more preferably 30 to 180 minutes.

The above nonoxidizing atmosphere is an atmosphere of an inert gas such as nitrogen, helium or argon, or a reducing atmosphere such as hydrogen.

After the amorphous silicon film is formed as described above, a polycrystal silicon film or polysilicon film can be obtained by carrying out a light treatment. In this case, the light source in use is, for example, a low-pressure or high-pressure mercury lamp, deuterium lamp, discharge lamp of a noble gas such as argon, krypton or xenon, YAG laser, argon laser, carbon dioxide laser, or excimer laser of XeF, XeCl, XeBr, KrF, KrCl, ArF or ArCl. Out of these, laser light is preferably used. Thereby, an amorphous silicon film can be polycrystallized efficiently. The output of these light sources is preferably 10 to 5,000 W, more preferably 100 to 1,000 W. The wavelength of these light sources is not particularly limited if light is absorbed by the high order silane compound in any way but preferably 170 to 600 nm. The irradiation dose is preferably 10 to 600 mJ/cm$^2$, more preferably 200 to 400 mJ/cm$^2$.

The atmosphere for the light treatment is not particularly limited.

The temperature for the light treatment is preferably room temperature to 1,500° C. and suitably selected according to the semiconductor characteristics of the target silicon film.

The amorphous silicon film or polycrystal silicon film obtained as described above is subjected to a heat treatment in an oxidizing atmosphere to convert the above amorphous silicon or polycrystal silicon into silicon oxide so as to obtain a substrate having a silicon oxide film mainly composed of silicon oxide. In this case, the heating temperature is preferably 300° C. to 550° C., more preferably 350° C. to 500° C. In this case, the heating time is not particularly limited but preferably 10 minutes to 20 hours, more preferably 10 minutes to 10 hours. The above oxidizing atmosphere is, for example, an air atmosphere.

Further, in the third step, the film of the high order silane compound is subjected to at least one treatment selected from the group consisting of a heat treatment and a light treatment in an oxidizing atmosphere to convert the high order silane compound into silicon oxide so as to obtain a substrate having a silicon oxide film. In this case, the heat treatment temperature is preferably 200° C. to 550° C., more preferably 300° C. to 500° C., and the heat treatment time is preferably 10 to 1,200 minutes, more preferably 10 to 600 minutes. In this case, the light treatment conditions are the same as the above preferred conditions for light irradiation when the amorphous silicon film is polycrystallized efficiently.

A substrate having the high order silane compound film, silicon film or silicon oxide film thereon (film-coated substrate of the present invention) is manufactured through the above steps.

Since the method of manufacturing a film-coated substrate of the present invention employs a liquid-phase process (liquid process), a bulky apparatus is not required, the use efficiency of the raw material is high, it is easy to handle as the raw material is liquid, and waste is hardly produced.

The method of manufacturing a film-coated substrate as described above can be applied to the formation of a transistor channel, source and drain, the formation of a silicon film for use in an optical sensor and the fabrication of a solar cell as well as the production of a semiconductor device substrate for various purposes having semiconductor devices arranged thereon.

<Film-Coated Substrate>

The film-coated substrate manufactured by the above method of manufacturing a film-coated substrate of the present invention can be used in electro-optic devices, memories and electronic devices.

The above electro-optic devices are devices having a liquid crystal element, an electrophoretic element with a dispersion medium containing electrophoretic particles dispersed therein or an EL element in which the above semiconductor device substrate is used in a drive circuit.

The above electronic devices are generally devices which exhibit a certain function and have a film-coated substrate manufactured by the method of manufacturing a film-coated substrate of the present invention, for example, devices which have the above electro-optic device or memory. Examples thereof include IC cards, mobile telephones, video cameras, personal computers, head mount displays, rear or front type projectors, facsimiles with a display function, finders for digital cameras, portable TVs, DSP, PDA, electronic databooks, electric bulletin boards and commercial displays.

While the high order silane composition and the method of manufacturing a film-coated substrate of the present invention and a film-coated substrate obtained thereby have been described above with reference to preferred examples, it is to be understood that the present invention is not limited thereto. For example, the method of manufacturing a film-coated substrate of the present invention may further comprise one or more optional steps which are known or which a person having ordinary skill in the art can arrive at by exerting his ordinary creativity as required in addition to the above-described steps.

EXAMPLES

The following examples are provided to further illustrate the present invention.

The treatment was carried out in a nitrogen atmosphere having an oxygen concentration of not more than 1 ppm unless stated otherwise.

The average value of the polymerization degree "n" of each of the high order silane compounds in the following examples and comparative examples is a value obtained by dividing the weight average value of absolute molecular weight measured by GPC-MALLS by 30.1 which is the formula weight of $SiH_2$.

1. Preparation of High Order Silane Composition

Example 1

Sample No. 1A

<Step 1A>

3 g of cyclopentasilane (boiling point: 194° C.) as a low order silane compound was first dissolved in 10 mL of benzene to prepare a cyclopentasilane solution.

The GPC-MALLS chart of cyclopentasilane used as the low order silane compound is shown in FIG. 1.

<Step 2A>

Then, this cyclopentasilane solution was put into a glass beaker and irradiated with ultraviolet light having a wavelength of 254 nm and an intensity of 50 mW/cm$^2$ for 10 minutes under agitation to polymerize cyclopentasilane so as to precipitate a high order silane compound from the solution.

<Step 3A>

Then, the precipitate contained in the solution was separated by filtration with a 0.5 μm microfilter to obtain the high order silane compound. The average value of the polymerization degree "n" of this high order silane compound was 200. The GPC-MALLS chart of the high order silane compound obtained herein is shown in FIG. 1 as "Sample No. 1A".

<Step 4A>

Thereafter, the high order silane compound was dissolved in cyclohexene to obtain a high order silane composition as Sample No. 1A.

The content of the high order silane compound in the high order silane composition was 20 wt %.

Comparative Example 1

Sample No. 2A

A high order silane composition as Sample No. 2A was obtained in the same manner as in Example 1 except that the high order silane compound was dissolved in cyclohexane in the step 4A of the above Example 1.

The content of the high order silane compound in this high order silane composition was 1 wt % which is much lower than the content of the high order silane compound in the high order silane composition as Sample No. 1A.

The average value of the polymerization degree "n" of the high order silane compound contained in this high order silane composition was 200.

Example 2

Sample No. 3A

A high order silane composition as Sample No. 3A was obtained in the same manner as in Example 1 except that the high order silane compound was dissolved in 1,4-cyclohexadiene in the step 4A of the above Example 1.

The content of the high order silane compound in this high order silane composition was 18 wt % which is almost the same as the content of the high order silane compound in the high order silane composition as Sample No. 1A.

The average value of the polymerization degree "n" of the high order silane compound contained in this high order silane composition was 200.

Comparative Example 2

Sample No. 4A

A high order silane composition as Sample No. 4A was obtained in the same manner as in Example 1 except that the high order silane compound was dissolved in benzene in the step 4A of the above Example 1.

The content of the high order silane compound in this high order silane composition was 0.1 wt % which is much lower than the content of the high order silane compound in the high order silane composition as Sample No. 1A.

The average value of the polymerization degree "n" of the high order silane compound contained in this high order silane composition was 200.

Example 3

Sample No. 5A

A high order silane composition as Sample No. 5A was obtained in the same manner as in Example 1 except that ultraviolet light having an intensity of 100 mW/cm$^2$ was irradiated for 30 minutes in the step 2A of the above Example 1. The GPC-MALLS chart of the high order silane compound obtained herein is shown in FIG. 1 as Sample No. 5A.

The content of the high order silane compound in this high order silane composition was 15 wt %.

The average value of the polymerization degree "n" of the high order silane compound contained in this high order silane composition was 500.

Comparative Example 3

Sample No. 6A

Although an attempt was made to prepare a high order silane composition as Sample No. 6A in the same manner as in Comparative Example 1 except that ultraviolet light having an intensity of 100 mW/cm$^2$ was irradiated for 30 minutes in the step 2A of the above Comparative Example 1, the high order silane compound did not dissolve.

Example 4

Sample No. 7A

A high order silane composition as Sample No. 7A was obtained in the same manner as in Example 2 except that ultraviolet light having an intensity of 100 mW/cm$^2$ was irradiated for 30 minutes in the step 2A of the above Example 2.

The content of the high order silane compound in this high order silane composition was 9 wt %.

The average value of the polymerization degree "n" of the high order silane compound contained in this high order silane composition was 500. Although the high order silane compound having a higher molecular weight was dissolved as compared with the high order silane composition as Sample No. 1A, the upper limit of the soluble content was low.

Comparative Example 4

Sample No. 8A

Although an attempt was made to prepare a high order silane composition as Sample No. 6A in the same manner as in Comparative Example 2 except that ultraviolet light having an intensity of 100 mW/cm$^2$ was irradiated for 30 minutes in the step 2A of the above Comparative Example 2, the high order silane compound did not dissolve.

Comparative Example 5

Sample No. 9A

A high order silane composition as Sample No. 9A was obtained in the same manner as in Example 1 except that the high order silane compound was dissolved in 3-methyl-cyclohexene in the step 4A of the above Example 1.

The content of the high order silane compound in this high order silane composition was 0.2 wt % which is much lower than the content of the high order silane compound in the high order silane composition as Sample No. 1A.

The average value of the polymerization degree "n" of the high order silane compound contained in this high order silane composition was 200.

Example 5

Sample No. 10A

A high order silane composition as Sample No. 10A, was obtained in the same manner as in Example 1 except that the high order silane compound was dissolved in a mixed solvent of cyclohexene and 3-methyl-cyclohexene (mixing ratio of 50:50 (weight ratio)) in the step 4A of the above Example 1.

The content of the high order silane compound in this high order silane composition was 15 wt % which is a little lower than the content of the high order silane compound in the high order silane composition as Sample No. 1A. However, it was much more improved than the content of the high order silane compound in the high order silane composition as Sample No. 9A.

The average value of the polymerization degree "n" of the high order silane compound contained in this high order silane composition was 200.

Comparative Example 6

Sample No. 11A

A high order silane composition as Sample No. 11A was obtained in the same manner as in Example 1 except that the high order silane compound was dissolved in 3,4-dihydro-2H-pyran in the step 4A of the above Example 1.

The content of the high order silane compound in this high order silane composition was 0.2 wt % which is much lower than the content of the high order silane compound in the high order silane composition as Sample No. 1A.

The average value of the polymerization degree "n" of the high order silane compound contained in this high order silane composition was 200.

Comparative Example 7

Sample No. 12A

Although an attempt was made to prepare a high order silane composition as Sample No. 12A in the same manner as in Example 1 except that the high order silane compound was dissolved in 1,2,3,4,5,6,7,8,9,10,11,12-dodecahydrooctalene in the step 4A of the above Example 1, the high order silane compound did not dissolve.

Comparative Example 8

Sample No. 13A

Although an attempt was made to prepare a high order silane composition as Sample No. 13A in the same manner as in Example 1 except that the high order silane compound was dissolved in 1,2,3,3a,4,4a,8,8a-octahydroindene in the step 4A of the above Example 1, the high order silane compound did not dissolve.

The results of the above experiments on the preparation of high order silane compositions are shown in Table 1.

2. Manufacture of Substrates Having a Silicon Film 10 substrates having a silicon film were manufactured below. The numerical values of the following measurement results are the average values of the 10 substrates.

Example 6

Step 1B

The high order silane composition as Sample No. 1A prepared in the above Example 1 was first applied to a quartz substrate by spin coating at 1,500 rpm to form a liquid film.

Step 2B

Then, the substrate having this liquid film was heated at 150° C. for 30 minutes to remove the solvent so as to obtain a high order silane compound film.

Step 3B

Then, the obtained high order silane compound film was heated at 350° C. for 60 minutes.
Thereby, a brownish-red film was obtained.
When this film was measured by RAMAN spectroscopy, it was found that this film was an amorphous silicon film. When SIMS analysis (measurement of surface composition) was made on this amorphous silicon film, it was almost composed of silicon atoms and contained 0.1% of oxygen, 0.05% of carbon and less than 0.01% of each of metal atoms as impurities.

Step 4B

Then, the obtained amorphous silicon film was irradiated with excimer laser light having a wavelength of 308 nm at an energy density of 300 mJ/cm$^2$ in the atmosphere (room temperature) so as to be polycrystallized. A substrate having a silicon film as Sample No. 1B was manufactured as described above.
When the silicon film of the substrate having a silicon film was measured by RAMAN spectroscopy, its crystallization rate was 95%.
The film thickness of the silicon film formed on the substrate having a silicon film obtained as described above was measured with an optical interferotype film thickness meter at 10 locations to obtain the average film thickness.
Table 2 shows the measured average film thickness.

Examples 7 to 10 and Comparative Examples 9 to 12

Substrates having a silicon film as Sample Nos. 2B to 5B, 7B and 9B to 11B were obtained in the same manner as in the above Example 6 except that the type of the high order silane composition shown in Table 2 was used.
The average film thickness obtained by measuring the thickness of the silicon film formed on each of the substrates at 10 locations and the crystallinity measured by RAMAN spectroscopy are shown in Table 2.

3. Manufacture of Substrates Having a Silicon Oxide Film 10 substrates having a silicon oxide film were manufactured below. The numerical values of the following measurement results are the average values of the 10 substrates.

Example 11

After the same treatment as in Example 6 was carried out until a high order silane compound film was obtained through the step 1B and the step 2B in the above Example 6, the nitrogen atmosphere in the chamber was gradually substituted by air to become an air atmosphere in 30 minutes while a heat treatment was carried out. Thereafter, the heat treatment was continued for another 30 minutes in the air atmosphere.
A heat treatment was then carried out at 400° C. for 60 minutes in the air in place of the step 4B. An achromatic transparent film was thereby obtained.
When ESCA analysis was made on this film, it was found that the film was a silicon oxide film containing silicon and oxygen in a ratio of almost 1:2. When SIMS analysis was made on this silicon oxide film, it contained 0.05% of carbon and less than 0.01% of each of metal atoms as impurities.
A substrate having a silicon oxide film as Sample No. 1C was thus manufactured.
The film thickness of the silicon oxide film formed on the substrate having a silicon oxide film obtained as described above was measured with an optical interferotype film thickness meter at 10 locations to obtain the average film thickness.
Table 3 shows the measured average film thickness and crystallinity of the silicon oxide film.

Examples 12 to 15 and Comparative Examples 13 to 16

Substrates having a silicon oxide film as Samples Nos. 2C to 5C, 7C and 9C to 11C were obtained in the same manner as in the above Example 11 except that the type of the high order silane composition shown in Table 3 was used.
When ESCA analysis was made on these films, it was found that all of them were silicon oxide films having a silicon atom/oxygen atom ratio of almost 1:2. When SIMS analysis was made on these silicon oxide films, they contained 0.05% of carbon and less than 0.01% of each of metal atoms as impurities.
Table 3 shows the average film thickness obtained by measuring the thickness of the silicon oxide film formed on each of the substrates at 10 locations.

TABLE 1

High order silane composition

| | | High order silane compound | | Properties of solvent | | | | | |
|---|---|---|---|---|---|---|---|---|---|
| | Name of composition | Average value of polymerizeion degree "n" | Content in composition (wt %) | Number of double bonds | Existence of alkyl group | Molecular weight | Existence of elements other than carbon and hydrogen | Refractive index | Specific permitivity |
| Ex. 1 | No. 1A | 200 | 20 | 1 | no | 82.1 | no | 1.45 | 2.2 |
| C. Ex. 1 | No. 2A | 200 | 1 | 0 | no | 84.1 | no | 1.43 | 2.0 |
| Ex. 2 | No. 3A | 200 | 18 | 2 | no | 80.1 | no | 1.41 | 2.0 |
| C. Ex. 2 | No. 4A | 200 | 0.1 | 3 | no | 78.1 | no | 1.50 | 2.3 |
| Ex. 3 | No. 5A | 500 | 15 | 1 | no | 82.1 | no | 1.45 | 2.2 |
| C. Ex. 3 | No. 6A | 500 | Not dissolved | 0 | no | 84.1 | no | 1.43 | 2.0 |
| Ex. 4 | No. 7A | 500 | 9 | 2 | no | 80.1 | no | 1.41 | 2.0 |
| C. Ex. 4 | No. 8A | 500 | Not dissolved | 3 | no | 78.1 | no | 1.50 | 2.3 |
| C. Ex. 5 | No. 9A | 200 | 0.2 | 1 | existent | 96.2 | no | 1.45 | 2.0 |
| Ex. 5 | No. 10A | 200 | 15 | 1 | no | 82.1 | no | 1.45 | 2.2 |
| | | | | 1 | existent | 96.2 | no | 1.45 | 2.0 |
| C. Ex. 6 | No. 11A | 200 | 0.2 | 1 | no | 84.1 | existent | 1.47 | 8.2 |
| C. Ex. 7 | No. 12A | 200 | Not dissolved | 1 | no | 192.3 | no | 1.49 | 2.3 |
| C. Ex. 8 | No. 13A | 200 | Not dissolved | 2 | no | 160.2 | no | 1.52 | 2.5 |

TABLE 2

Substrates having a silicon film

| | Name of composition | Sample No. | Silicon film Film thickness (nm) | Crystallinity (%) |
|---|---|---|---|---|
| Ex. 6 | No. 1A | No. 1B | 202 | 95 |
| C. Ex. 9 | No. 2A | No. 2B | unmeasurable because it is too thin | unmeasurable |
| Ex. 7 | No. 3A | No. 3B | 195 | 90 |
| C. Ex. 10 | No. 4A | No. 4B | unmeasurable because it is too thin | unmeasurable |
| Ex. 8 | No. 5A | No. 5B | 175 | 88 |
| Ex. 9 | No. 7A | No. 7B | 100 | 75 |
| C. Ex. 11 | No. 9A | No. 9B | unmeasurable because it is too thin | unmeasurable |
| Ex. 10 | No. 10A | No. 10B | 163 | 85 |
| C. Ex. 12 | No. 11A | No. 11B | unmeasurable because it is too thin | unmeasurable |

Ex.: Example,
C. Ex.: Comparative Example

TABLE 3

Substrates having a silicon oxide film

| | Name of composition | Sample No. | Silicon oxide film Film thickness (nm) |
|---|---|---|---|
| Ex. 11 | No. 1A | No. 1C | 285 |
| C. Ex. 13 | No. 2A | No. 2C | unmeasurable because it is too thin |
| Ex. 12 | No. 3A | No. 3C | 269 |
| C. Ex. 14 | No. 4A | No. 4C | unmeasurable because it is too thin |
| Ex. 13 | No. 5A | No. 5C | 253 |
| Ex. 14 | No. 7A | No. 7C | 149 |
| C. Ex. 15 | No. 9A | No. 9C | unmeasurable because it is too thin |
| Ex. 15 | No. 10A | No. 10C | 231 |
| C. Ex. 16 | No. 11A | No. 11C | unmeasurable because it is too thin |

Ex.: Example,
C. Ex.: Comparative Example

As for the high order silane composition Nos. 6A, 8A, 12A and 13A, since the high order silane compounds could not be dissolved in these compositions, the manufacture of a substrate having a silicon film and a substrate having a silicon oxide film was not carried out.

Effect of the Invention

The high order silane composition of the present invention is stable and easy to handle and can provide a high-quality film having a desired thickness. That is, since the high order silane composition of the present invention does not need to contain a low order silane compound unlike the high order silane composition disclosed by JP-A 2003-313299, it is possible to easily form a silicon film or a silicon oxide film without defects such as the production of pores, the volume contraction of the film, and the formation of irregularities on the film surface due to the volatilization of the low order silane compound during the formation of a film. For example, a film having an ultra-fine pattern on the order of several tens of nm can be formed.

Therefore, the method of manufacturing a film-coated substrate of the present invention from the high order silane composition of the present invention makes it possible to easily form a high-quality silicon film or silicon oxide film having a desired thickness and a fine pattern in which the above defects are not observed with a simple liquid-phase process.

The invention claimed is:

1. A composition comprising a high order silane compound and a solvent, wherein
the high order silane compound is obtained by irradiating at least one silane compound selected from the group consisting of compounds represented by the following formulas (2) and (3) with ultraviolet light $$Si_iX_{2i} \tag{2}$$

$$Si_jX_{2j-2} \tag{3}$$

where X is a hydrogen atom or a halogen atom, i is an integer of 3 to 8, and j is an integer of 4 to 14, and
the solvent comprises a cyclic hydrocarbon which:
has one or two double bonds and no alkyl group,
consists of carbon and hydrogen,
has a refractive index of 1.40 to 1.51,
has a specific permittivity of not more than 3.0, and
has a molecular weight of not more than 180.

2. The high order silane composition according to claim 1, wherein the content of the high order silane compound in the high order silane composition is 1 to 50 wt %.

3. The high order silane composition according to claim 1, wherein the solvent consists of the cyclic hydrocarbon.

4. The high order silane composition according to claim 1, wherein the solvent comprises the cyclic hydrocarbon and a compound having a silicon atom in the molecule.

5. A method of manufacturing a film-coated substrate, comprising supplying the high order silane composition of claim 1 onto a substrate and removing the solvent from the high order silane composition to form a film of a high order silane compound on said substrate.

6. The method of manufacturing a film-coated substrate according to claim 5, which further comprises subjecting the film of the high order silane compound on said substrate to at least one treatment selected from the group consisting of a heat treatment and a light treatment in a nonoxidizing atmosphere to convert the high order silane compound into silicon so as to form a silicon film on said substrate.

7. The method of manufacturing a film-coated substrate according to claim 5, which further comprises subjecting the film of the high order silane compound on said substrate to a heat treatment in a nonoxidizing atmosphere to convert the high order silane compound into silicon and subjecting the silicon to a heat treatment in an oxidizing atmosphere to convert the silicon into silicon oxide so as to form a silicon oxide film on said substrate.

8. The method of manufacturing a film-coated substrate according to claim 5, which further comprises subjecting the film of the high order silane compound on said substrate to at least one treatment selected from the group consisting of a heat treatment and a light treatment in an oxidizing atmosphere to convert the high order silane compound into silicon oxide so as to form a silicon oxide film on said substrate.

9. The high order silane composition according to claim 1, wherein the high order silane compound is obtained by irradiating a silane compound represented by formula (2) with ultraviolet light.

10. The high order silane composition according to claim 9, wherein the silane compound represented by formula (2) is selected from the group consisting of cyclotrisilane, cyclotetrasilane, cyclopentasilane, cyclohexasilane, cycloheptasilane and mixtures thereof.

11. The high order silane composition according to claim 1, wherein the high order silane compound is obtained by irradiating a silane compound represented by formula (3) with ultraviolet light.

12. The high order silane composition according to claim 11, wherein the silane compound represented by formula (3) is selected from the group consisting of 1,1'-bicyclobutasilane, 1,1'-bicyclopentasilane, 1,1'-bicyclohexasilane, 1,1'-bicycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2.2]pentasilane, spiro[3.3]heptasilane, spiro[4.4]nonasilane, spiro[4.5]decasilane, spiro[4.6]undecasilane, spiro[5.5]undecasilane, spiro[5.6]dodecasilane, spiro[6.6]tridecasilane and mixtures thereof.

13. The high order silane composition according to claim 1, wherein the cyclic hydrocarbon has a refractive index of 1.42 to 1.49 and a specific permittivity of not more than 3.0.

14. The high order silane composition according to claim 13, wherein the cyclic hydrocarbon has a molecular weight of 60 to 160 and a specific permittivity of not more than 2.3.

15. The high order silane composition according to claim 13, wherein the cyclic hydrocarbon is a cyclic hydrocarbon which has one double bond, a specific permittivity of not more than 2.3 and a molecular weight of 65 to 120.

16. The high order silane composition according to claim 1, wherein the cyclic hydrocarbon is selected from the group consisting of 1,2,3,4,4a,5,6,8a-octahydronaphthalene, 1,2,3,4,5,6,7,8-octahydronaphthalene, 1,2,3,4,5,8-hexahydronaphthalene, 1,2,3,4,5,6-hexahydronaphthalene, 1,2,4a,5,8,8a-hexahydronaphthalene, 2,3,3a,4,5,7a-hexahydro-1H-indene, 2,3,3a,4,7,7a-hexahydro-1H-indene, 2,3,3a,4,5,6-hexahydro-1H-indene, 2,3,4,5,6,7-hexahydro-1H-indene, 2,4,7,7a-tetrahydro-1H-indene, 2,3,4,7-tetrahydro-1H-indene, 2,3,4,5-tetrahydro-1H-indene, 4,5,6,7-tetrahydro-1H-indene, 4,5,6,7-tetrahydro-2H-indene, 1,2,3,3a,4,6a-hexahydropentalene, 1,2,3,3a,4,5-hexahydropentalene, 1,2,3,4,5,6-hexahydropentalene, 1,2,3,4-tetrahydropentalene, 1,2,6,6a-tetrahydropentalene, 1,3a,6,6a-tetrahydropentalene, cyclopropene, cyclobutene, cyclobuta-1,2-diene, cyclobuta-1,3-diene, cyclopentene, cyclopenta-1,2-diene, cyclopenta-1,3-diene, cyclohexene, cyclohexa-1,2-diene, cyclohexa-1,3-diene, cyclohexa-1,4-diene, cycloheptene, cyclohepta-1,2-diene, cyclohepta-1,3-diene, cyclohepta-1,4-diene, cyclooctene, cycloocta-1,2-diene, cycloocta-1,3-diene, cycloocta-1,4-diene, cycloocta-1,5-diene, cyclononene, cyclonona-1,2-diene, cyclonona-1,3-diene, cyclonona-1,4-diene, cyclonona-1,5-diene, cyclodecene, cyclodeca-1,2-deine, cyclodeca-1,3-diene, cyclodeca-1,4-diene, cyclodeca-1,5-diene, cyclodeca-1,6-diene, bicyclo[2.2.1]hepta-2-ene, bicyclo[2.2.1]hepta-1-ene, bicyclo[2.2.1]hepta-1,3-diene, bicyclo [2.2.1]hepta-2,5-diene, bicyclo[2.2.2]octa-2-ene, bicyclo[2.2.2]octa-2,5-diene, bicyclo[2.2.2]octa-1,2-diene, bicyclo[2.2.2]octa-1,5-diene, bicyclo[2.2.2]octa-1,4-diene, 1,1'-bi(cyclohexa-3-ene), 1-cyclohexylcyclohexa-1,4-diene, 5-cyclohexylcyclohexa-1,3-diene, (1R,6S)-bicyclo[4.2.0]octa-3-ene, (1R,6S)-bicyclo[4.2.0]octa-3,7-diene and mixtures thereof.

17. The high order silane composition according to claim 16, wherein the high order silane compound is obtained by irradiating a silane compound represented by formula (2) with ultraviolet light, and wherein the silane compound represented by formula (2) is selected from the group consisting of cyclotetrasilane, cyclopentasilane, cyclohexasilane, cycloheptasilane and mixtures thereof.

* * * * *